(12) United States Patent
Lim et al.

(10) Patent No.: US 10,778,175 B2
(45) Date of Patent: Sep. 15, 2020

(54) COUPLER CIRCUIT WITH PHASE COMPENSATION FUNCTION

(71) Applicant: Samsung Electro-Mechanics Co., Ltd., Suwon-si (KR)

(72) Inventors: Jong Mo Lim, Suwon-si (KR); Hyun Jin Yoo, Suwon-si (KR); Yoo Sam Na, Suwon-si (KR); Hyun Hwan Yoo, Suwon-si (KR); Hyung Jun Cho, Suwon-si (KR); Yoo Hwan Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 68 days.

(21) Appl. No.: 16/172,002

(22) Filed: Oct. 26, 2018

(65) Prior Publication Data

US 2019/0348961 A1  Nov. 14, 2019

(30) Foreign Application Priority Data

May 11, 2018  (KR) .................. 10-2018-0054404

(51) Int. Cl.
*H03F 3/14* (2006.01)
*H03H 7/18* (2006.01)
(Continued)

(52) U.S. Cl.
CPC ............. *H03H 7/18* (2013.01); *H01P 5/16* (2013.01); *H03F 3/195* (2013.01); *H03F 3/213* (2013.01);
(Continued)

(58) Field of Classification Search
CPC .......... H03H 7/18; H03F 3/213; H03F 3/195; H03F 2200/451; H03F 2200/255;
(Continued)

(56) References Cited

U.S. PATENT DOCUMENTS 7,821,352 B1 * 10/2010 Sanvoravong .......... H01P 5/185
                                                   333/116
7,907,032 B2 *  3/2011 Yamamoto ............... H01P 5/18
                                                   333/116
(Continued)

FOREIGN PATENT DOCUMENTS

| JP | 2001-111313 A | 4/2001 |
| JP | 2010-161466 A | 7/2010 |
| KR | 10-2012-0051580 A | 5/2012 |

OTHER PUBLICATIONS

Korean Office Action dated Sep. 10, 2019 in counterpart Korean Patent Application No. 10-2018-0054404 (4 pages in English and 4 pages in Korean).

(Continued)

Primary Examiner — Khanh V Nguyen
(74) Attorney, Agent, or Firm — NSIP Law

(57) ABSTRACT

A coupler circuit includes: a signal line disposed between a first terminal and a second terminal; a coupling line disposed between a coupling port and an isolation port such that the coupling line is coupled to the signal line and is configured to extract a coupling signal from the signal line; and a coupling adjusting circuit connected to the coupling port and the isolation port, and configured to reduce changes in an amount of coupling according to a change in a frequency band of a signal passing through the signal line.

13 Claims, 14 Drawing Sheets

(51) Int. Cl.
   *H01P 5/16* (2006.01)
   *H03F 3/195* (2006.01)
   *H03F 3/213* (2006.01)

(52) U.S. Cl.
   CPC .. *H03F 2200/255* (2013.01); *H03F 2200/451* (2013.01)

(58) Field of Classification Search
   CPC ........ H03F 2200/204; H01P 5/16; H01P 5/18; H01P 5/184; H01P 5/186; H01P 5/185
   USPC .......................................... 330/307; 333/116
   See application file for complete search history.

(56) References Cited

U.S. PATENT DOCUMENTS

| | | | | |
|---|---|---|---|---|
| 8,289,102 B2* | 10/2012 | Yamamoto | ............... | H01P 5/184 333/116 |
| 8,536,956 B2* | 9/2013 | Tamaru | ................... | H01P 5/184 333/112 |
| 8,922,295 B2* | 12/2014 | Haruna | ................... | H01P 5/185 333/109 |
| 10,181,631 B2* | 1/2019 | Frederick | ................ | H01P 5/184 |
| 10,249,930 B2* | 4/2019 | Srirattana | ............... | H01P 5/187 |
| 10,340,575 B2* | 7/2019 | Tanaka | ................... | H01P 5/184 |
| 2010/0171564 A1 | 7/2010 | Yamamoto et al. | | |
| 2012/0119846 A1 | 5/2012 | Haruna | | |

OTHER PUBLICATIONS

Young-Hoon Chun, et al., "A Novel Microstrip Line Backward Directional Coupler with High Directivity," *Proceedings of the IEEE MTT-D International Microwave Symposium Digest*, Fort Worth, TX, USA, Jun. 2004, pp. 1891-1894.

V. Solomko, et al., "Tunable directional coupler for RF front-end applications," *Electronics Letters*, vol. 51, No. 24, Nov. 2015 (2 pages, in English).

\* cited by examiner

COUPLER CIRCUIT WITH PHASE COMPENSATION FUNCTION

CROSS-REFERENCE TO RELATED APPLICATIONS

This application claims the benefit under 35 U.S.C. § 119(a) of Korean Patent Application No. 10-2018-0054404 filed on May 11, 2018 in the Korean Intellectual Property Office, the entire disclosure of which is incorporated herein by reference for all purposes.

BACKGROUND

1. Field

The following description relates to a coupler circuit having a phase compensation function.

2. Description of Related Art

Generally, an RF front end module (FEM) may include a power amplifier (PA) and a power detector to control the PA.

Typically, isolator-type power detectors and directional coupler-type power detectors are provided in an RF FEM. Directional coupler-type power detectors are widely used due to their overall cost and ease of implementation.

The varying environments in which a mobile communication device including the RF FEM is used can cause variations in an impedance of an antenna of the mobile communication device, and accordingly, an error may occur in the output power detection of the PA, due to reflected waves generated by the antenna. High directivity coupler performance is required to accurately detect the output level of the PA while minimizing the effect on the reflected waves generated by the antenna.

As an example of a related coupler, a coupler for use in an FEM can detect the magnitude of the output signal outputted from the PA to control the PA.

At this time, when the impedance of the antenna changes from 50 ohms, a reflected wave is generated, and the reflected wave may adversely affect the output of the coupler. For example, since the output voltage Vc of the coupler may include both the output voltage Vp of the PA and the components that are coupled by the voltage Vr by the reflected waves, the output level of the detected power amplifier includes an error component due to the reflected waves, which subsequently lowers accuracy.

Meanwhile, an isolation level of the coupling voltage Vc_r smaller by the voltage Vr by the reflected wave, in comparison to a coupling level of the coupling voltage Vc_p, by the output voltage Vp of the power amplifier, enables more accurate detection of the output power of the power amplifier, and the difference between the coupling level and the isolation level is referred to as "directivity."

In addition, as the communication module has become smaller in size, more attempts have been made to provide the coupler as an IC, but these attempts have been met with the problems explained below.

For example, a coupled line coupler has a characteristic in which a coupling value increases as a frequency increases due to parasitic capacitance between a signal line and a coupled line. Therefore, a circuit having an electrical length corresponding to a specific wavelength is used in order to enable many coupler structures to achieve a constant coupling value in a specific frequency range. However, there may be a realization that a coupler provided as an IC causes a problem of the size of the circuit being reduced to be smaller than the wavelength, and that it is difficult to provide a coupler having a constant coupling value according to the frequency.

In addition, when the coupler is implemented in the form of a module for mounting a silicon chip on a printed circuit board (PCB), there may be a problem that the directivity performance is deteriorated due to impedance mismatch by the integrated structure, unbalance of dielectric constants of the materials around the coupler circuit, asymmetry of the coupler circuit, or the like.

In addition, when adopted in a system that uses a plurality of frequency bands, the related coupler has a problem in that the amount of coupling is changed as the frequency band is changed. Further, there may be a problem in which the amount of coupling varies due to the coupling effect of the reflected wave, thereby reducing the accuracy of coupling detected by the coupling, and accordingly deteriorating the directivity characteristics of the coupler.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a coupler circuit having a phase compensation function includes: a signal line disposed between a first terminal and a second terminal; a coupling line disposed between a coupling port and an isolation port such that the coupling line is coupled to the signal line and is configured to extract a coupling signal from the signal line; and a coupling adjusting circuit connected to the coupling port and the isolation port, and configured to reduce changes in an amount of coupling according to a change in a frequency band of a signal passing through the signal line.

The coupling adjusting circuit may be configured to reduce a phase difference between the coupling port and the isolation port.

The coupling adjusting circuit may include a first impedance circuit connected between the coupling port and the isolation port, a second impedance circuit connected between the coupling port and ground, and a third impedance circuit connected between the isolation port and the ground.

The first impedance circuit may include a resistor and a capacitor connected between the coupling port and the isolation port in series.

The second impedance circuit may include a capacitor connected between the coupling port and the ground.

The third impedance circuit may include a resistor connected between the isolation port and the ground.

In another general aspect, a coupler circuit having a phase compensation function includes: a signal line disposed between a first terminal and a second terminal; a first coupling line disposed between a first coupling port and a first isolation port such that the first coupling line is coupled to the signal line and is configured to extract a first coupling signal from the signal line; a first coupling adjusting circuit connected to the first coupling port and the first isolation port, and configured to reduce changes in an amount of coupling according to a change in a frequency band of a signal passing through the signal line; a second coupling line disposed between a second coupling port and a second isolation port such that the second coupling line is coupled to the signal line and is configured to extract a second coupling signal from the signal line; and a second coupling adjusting circuit connected to the second coupling port and the second isolation port, and configured to reduce an amount of coupling according to a change in a frequency band of a signal passing through the signal line.

The first coupling adjusting circuit may be configured to reduce a phase difference between the first coupling port and the first isolation port, and the second coupling adjusting circuit may be configured to reduce a phase difference between the second coupling port and the second isolation port.

The first coupling adjusting circuit may include a first impedance circuit connected between the first coupling port and the first isolation port, a second impedance circuit connected between the first coupling port and ground, and a third impedance circuit connected between the first isolation port and the ground.

The second coupling adjusting circuit may include a fourth impedance circuit connected between the second coupling port and the second isolation port, a fifth impedance circuit connected between the second coupling port and the ground, and a sixth impedance circuit connected between the second isolation port terminal and the ground.

The first impedance circuit may include a first resistor and a first capacitor connected between the first coupling port and the first isolation port in series, and the fourth impedance circuit may include a second resistor and a second capacitor connected between the second coupling port and the second isolation port in series.

The second impedance circuit may include a first capacitor connected between the first coupling port and the ground, and the fifth impedance circuit may include a second capacitor connected between the second coupling port and the ground.

The third impedance circuit may include a first resistor connected between the first isolation port and the ground, and the sixth impedance circuit may include a second resistor connected between the second isolation port and the ground.

The coupler circuit may further include a first switching circuit including a first node connected to the first coupling port, a second node connected to the first coupling port, and a common node connected to a first common coupling port, and wherein the first switching circuit is configured to selectively connect one of the first node and the second node to the common node.

In another general aspect, a single-chip power amplifier includes: a power amplifier; and a coupler circuit connected to the power amplifier, and including a signal line disposed between a first terminal and a second terminal, a coupling line disposed between a coupling port and an isolation port such that the coupling line is coupled to the signal line and is configured to extract a coupling signal from the signal line, and a coupling adjusting circuit connected to the coupling port and the isolation port, and configured to reduce changes in an amount of coupling according to a change in a frequency band of a signal passing through the signal line.

The single-chip power amplifier may further include: an input terminal connected to an input of the power amplifier; and an output terminal connected to the second terminal, wherein the first terminal is connected to an output of the power amplifier.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
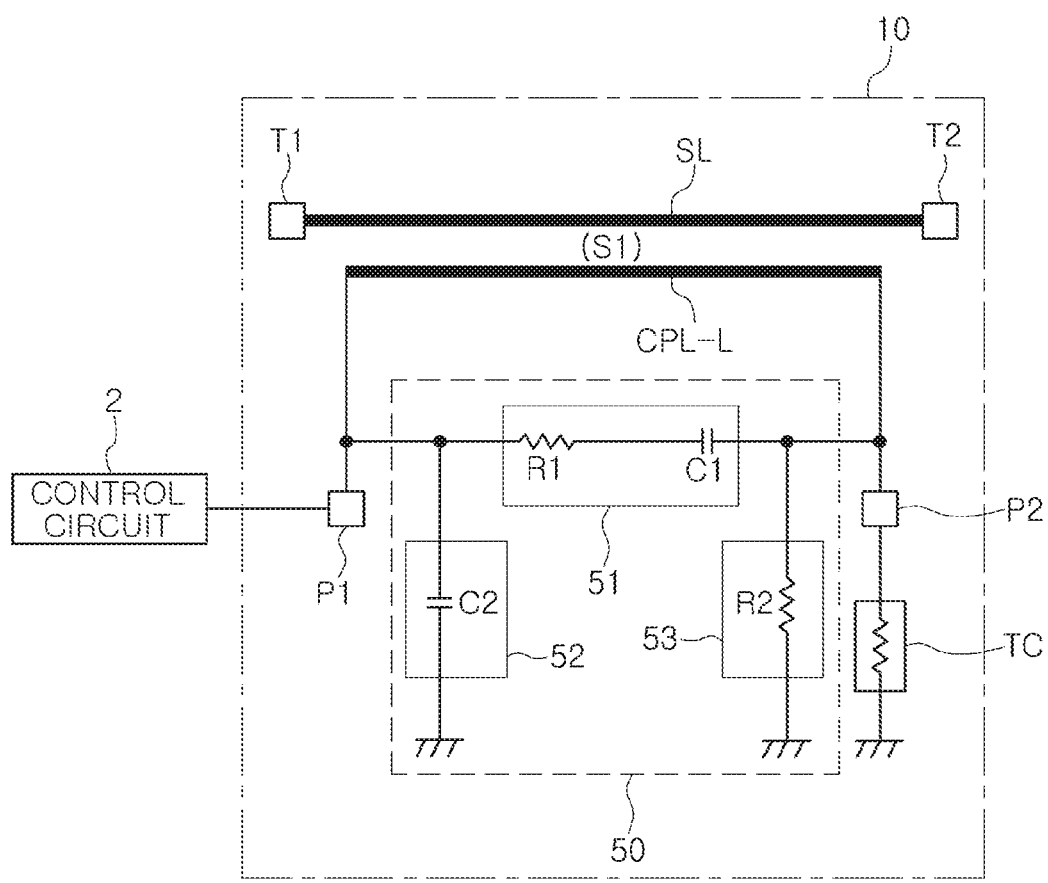
FIG. 1 is a view of a coupler circuit, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

An aspect of the present disclosure may provide a coupler circuit capable of reducing changes in an amount of coupling due to variations in a frequency band when using a plurality of frequency bands.

FIG. 1 is a view of a coupler circuit 10, according to an embodiment.

Referring to FIG. 1, the coupler circuit 10 may include a signal line SL, a coupling line CPL_L, and a coupling adjusting circuit 50.

The signal line SL may be disposed between a first terminal T1 and a second terminal T2. As an example, the signal line SL may be connected to an output of a power amplifier, or to the signal line between an antenna switch and an antenna, or to the signal line between the power amplifier and the antenna switch, but is not limited to such connections. Accordingly, the signal line SL may be applied to a signal line where signal detection is necessary.

The coupling line CPL_L may be disposed between a coupling port P1 and an isolation port P2, and adjacent to the signal line SL, such that the coupling line CPL_L is coupled to the signal line SL and is configured to extract a coupling signal S1 from the signal line SL.

As an example, the coupling port P1 may be connected to a control circuit 2, and the isolation port P2 may be grounded through a termination circuit TC. In this example, the coupling signal S1 may be transmitted to the control circuit 2 through the coupling port P1. As an example, the termination circuit TC may include at least a resistor.

The coupling adjusting circuit 50 may be connected to the coupling port P1 and the isolation port P2 to reduce a change in the amount of coupling according to a change of frequency band of the signal passing through the signal line SL.

Accordingly, a constant amount of coupling may be maintained even with the change in the frequency band.

In addition, the coupling adjusting circuit 50 may reduce a phase difference between the coupling port P1 and the isolation port P2. As an example, the smaller the phase difference between the coupling port P1 and the isolation port P2 becomes, the more the amount of coupling due to the reflected waves can be reduced, and as a result, the directivity may be enhanced.

Reduction of directivity in the coupler is typically caused due to the inhomogeneity of the dielectric materials around the coupling line and signal line. The fact that the phase difference between the coupling port P1 and the isolation port P2 is reduced to 0 (zero) has the same effect as making the electrical length of the coupling section 0 (zero), and this is effective in both an odd mode in which the phases of the coupling line and signal line are opposite to each other and in an even mode in which the phases of the coupling line and the signal line are the same, and has the same effect as the propagation speed of the even mode and the odd mode being infinity. This minimizes the effect of the inhomogenous dielectrics around the coupling line and the signal line, thereby eliminating the cause of the reduction of directivity.

The coupling adjusting circuit 50 may include a first impedance circuit 51, a second impedance circuit 52, and a third impedance circuit 53.

The first impedance circuit 51 may be connected between the coupling port P1 and the isolation port P2. For example, the first impedance circuit 51 may include a first resistor R1 and a first capacitor C1 connected in series between the coupling port P1 and the isolation port P2. As an example, as shown in FIG. 1, the first impedance circuit 51 may include a first resistor R1 having one end connected to the coupling port P1, and a first capacitor C1 having one end connected to the other end of the first resistor R1 and the other end connected to the isolation port P2, but not limited thereto. Accordingly, the first resistor R11 and the first capacitor C11 may be connected in the reverse order.

The first impedance circuit 51 may contribute to adjusting the phase difference between the coupling port P1 and the isolation port P2, and this will be described below with reference to FIGS. 9, 10 and 11.

The second impedance circuit 52 may be connected between the coupling port P1 and ground. As an example, the second impedance circuit 52 may include a second capacitor C2 connected between the coupling port P1 and ground. The second impedance circuit 52 may contribute to adjusting the phase difference between the coupling port P1 and the isolation port P2 and to maintaining a constant amount of coupling, and this will be described below with reference to FIGS. 9, 10, and 11.

The third impedance circuit 53 may be connected between the isolation port P2 and ground. As an example, the third impedance circuit 53 may include a second resistor R2 connected between the isolation port P2 and ground. The third impedance circuit 53 may contribute to adjusting the phase difference between the coupling port P1 and the isolation port P2, and this will be described below with reference to FIGS. 9, 10 and 11.

For example, the coupler circuit 10 may operate as a forward coupler circuit when a signal is inputted through the first terminal T1 and a signal is outputted through the second terminal T2. Alternatively, the coupler circuit 10 may operate as a reverse coupler circuit when a signal is inputted through the second terminal T2 and a signal is outputted through the first terminal T1.

In an example, the coupler circuit 10 may be implemented as an IC, such as an IC including a termination circuit TC, for example. As another example, an IC excluding a termination circuit TC may be implemented, in which case the termination circuit TC may be connected from outside of the IC.

Figure 2:
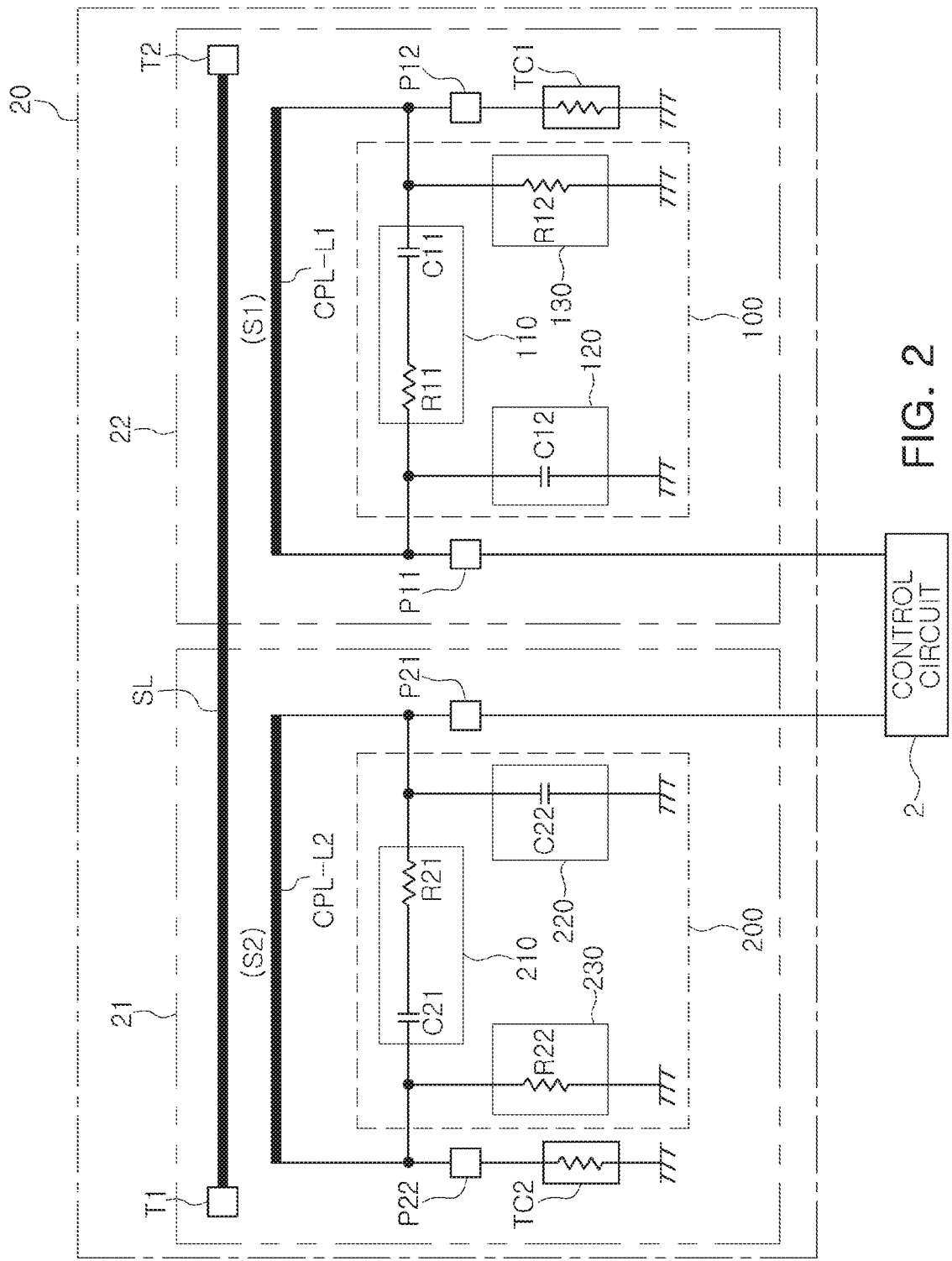
FIG. 2 is a view of a coupler circuit, according to an embodiment.

FIG. 2 is a view of a coupler circuit 20, according to an embodiment.

Referring to FIG. 2, the coupler circuit 20 may include a first coupler circuit 21 and a second coupler circuit 22. The first coupler circuit 21 may include a signal line SL, a first coupling line CPL_L1 and a first coupling adjusting circuit 100, and the second coupler circuit 22 may include the signal line SL, a second coupling line CPL_L2, and a second coupling adjusting circuit 200.

The signal line SL may be disposed between a first terminal T1 and a second terminal T2. As an example, the signal line SL may be connected to an output of a power amplifier, or to the signal line between an antenna switch and an antenna, or to the signal line between the power amplifier and the antenna switch, but not limited to such connections. Accordingly, the signal line SL may be applied to a signal line where signal detection is necessary.

The first coupling line CPL_L1 may be disposed between a first coupling port P11 and a first isolation port P12 and adjacent to the signal line SL, such that the first coupling line CPL_L1 is firstly coupled to the signal line SL and is configured to extract a first coupling signal S1 from the signal line SL. As an example, the first coupling port P11 may be connected to a control circuit, and the first isolation port P12 may be grounded through a termination circuit TC1. In this example, the first coupling signal S1 may be transmitted to the control circuit through the first coupling port P11. As an example, the termination circuit TC1 may include at least a resistor.

The first coupling adjusting circuit 100 may be connected to the first coupling port P11 and the first isolation port P12 to reduce a change in the amount of coupling according to a change of frequency band of the signal passing through the signal line SL. Accordingly, a constant amount of coupling may be maintained even with the change in the frequency band. In addition, the first coupling adjusting circuit 100 may reduce a phase difference between the first coupling port P11 and the first isolation port P12. As an example, the smaller the phase difference between the coupling port P1 and the isolation port P2 becomes, the more the amount of coupling due to the reflected waves can be reduced.

The second coupling line CPL_L2 may be disposed between a second coupling port P21 and a second isolation port P22, and adjacent to the signal line SL, such that the second coupling line CPL_L2 is secondly coupled to the signal line SL and is configured to extract the second coupling signal S2 from the signal line SL. As an example, the second coupling port P21 may be connected to the control circuit 2, and the second isolation port P22 may be grounded through a termination circuit TC2. In this example, the second coupling signal S2 may be transmitted to the control circuit 2 through the second coupling port P21. As an example, the termination circuit TC2 may include at least a resistor.

The second coupling adjusting circuit 200 may be connected to the second coupling port P21 and the second isolation port P22 to reduce a change in the amount of coupling according to a change of frequency band of the signal passing through the signal line SL. Accordingly, a constant amount of coupling may be maintained even with the change in the frequency band. In addition, the second coupling adjusting circuit 200 may reduce a phase difference between the second coupling port P21 and the second isolation port P22. As an example, the smaller the phase difference between the second coupling port P21 and the second isolation port P22 becomes, the more the amount of coupling due to the reflected waves can be reduced.

The first coupling adjusting circuit 100 may include a first impedance circuit 110, a second impedance circuit 120, and a third impedance circuit 130.

The first impedance circuit 110 may be connected between the first coupling port P11 and the first isolation port P12. For example, the first impedance circuit 110 may include a first resistor R11 and a first capacitor C11 connected in series between the first coupling port P11 and the first isolation port P12. As an example, the first impedance circuit 110 may include a first resistor R11 having one end connected to the coupling port P11, and a first capacitor C11 having one end connected to the other end of the first resistor R11 and the other end connected to the first isolation port P12, but not limited thereto. Accordingly, the first resistor R11 and the first capacitor C11 may be connected in the reverse order. The first impedance circuit 110 may contribute to adjusting the phase difference between the first coupling port P11 and the first isolation port P12. Reference can be made to FIGS. 9A, 9B, 10A, 10B, 11A, and 11B for the foregoing.

The second impedance circuit 120 may be connected between the first coupling port P11 and ground. As an example, the second impedance circuit 120 may include a second capacitor C12 connected between the first coupling port P11 and ground. The second impedance circuit 120 may contribute to adjusting the phase difference between the first coupling port P11 and the first isolation port P12 and to maintaining a constant amount of coupling. Reference can be made to FIGS. 9A, 9B, 10A, 10B, 11A, and 11B for the foregoing.

The third impedance circuit 130 may be connected between the first isolation port P12 and ground. As an example, the third impedance circuit 130 may include a second resistor R12 connected between the first isolation port P12 and ground. The third impedance circuit 130 may contribute to adjusting the phase difference between the first coupling port P11 and the first isolation port P12, and reference can be made to FIGS. 9, 10 and 11 for the foregoing.

The second coupling adjusting circuit 100 may include a fourth impedance circuit 210, a fifth impedance circuit 220 and a sixth impedance circuit 230.

The fourth impedance circuit 210 may be connected between the second coupling port P21 and the second isolation port P22. For example, the fourth impedance circuit 210 may include a third resistor R21 and a third capacitor C21 connected in series between the second coupling port P21 and the second isolation port P22. As an example, the fourth impedance circuit 210 includes a third resistor R21 having one end connected to the second coupling port P21, and a third capacitor C21 having one end connected to the other end of the third resistor R21 and the other end connected to the second isolation port P22, but is not limited to such a configuration. Accordingly, the third resistor R21 and the third capacitor C21 may be connected in the reverse order. The fourth impedance circuit 210 may contribute to adjusting the phase difference between the second coupling port P21 and the second isolation port P22. Reference can be made to FIGS. 9A, 9B, 10A, 10B, 11A, and 11B for the above.

The fifth impedance circuit 220 may be connected between the second coupling port P21 and ground. As an example, the fifth impedance circuit 220 may include a fourth capacitor C22 connected between the second coupling port P21 and ground. The fifth impedance circuit 220 may contribute to adjusting the phase difference between the second coupling port P21 and the second isolation port P22 and to maintaining a constant amount of coupling. Reference can be made to FIGS. 9A, 9B, 10A, 10B, 11A, and 11B for the above.

The sixth impedance circuit 230 may be connected between the second isolation port P22 and ground. As an example, the sixth impedance circuit 130 may include a fourth resistor R22 connected between the second isolation port P22 and ground.

The sixth impedance circuit 230 may contribute to adjusting the phase difference between the second coupling port P21 and the second isolation port P22, and reference can be made to FIGS. 9A, 9B, 10A, 10B, 11A, and 11B for the foregoing.

Figure 3:
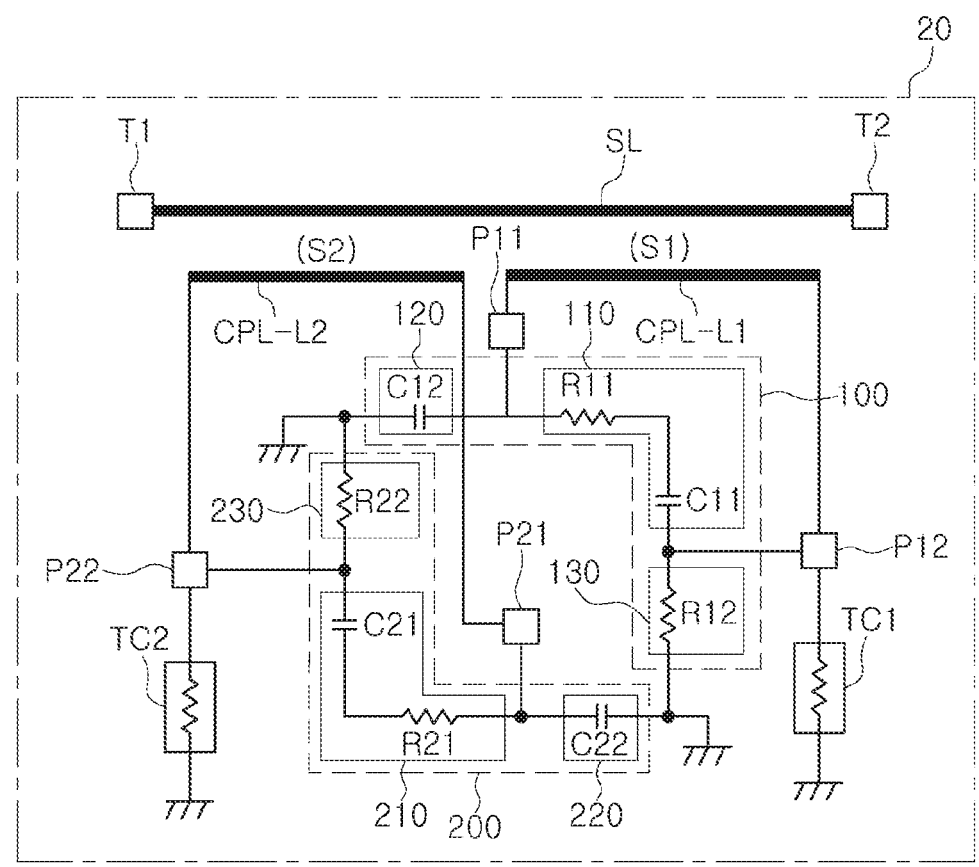
FIG. 3 shows an equivalent circuit diagram of the coupler circuit in FIG. 2.

FIG. 3 shows an equivalent circuit diagram of the coupler circuit 20 in FIG. 2.

The coupler circuit 20 may include the first coupling adjusting circuit 100 and the second coupling adjusting circuit 200, as illustrated as shown in FIG. 3.

Referring to FIG. 3, the coupled equivalent circuit of the first coupling adjusting circuit 100 and the second coupling adjusting circuit 200 may be expressed as a polyphase circuit. As an example, a polyphase circuit may include a closed circuit structure in which resistors and capacitors are repeatedly used.

Figure 4:
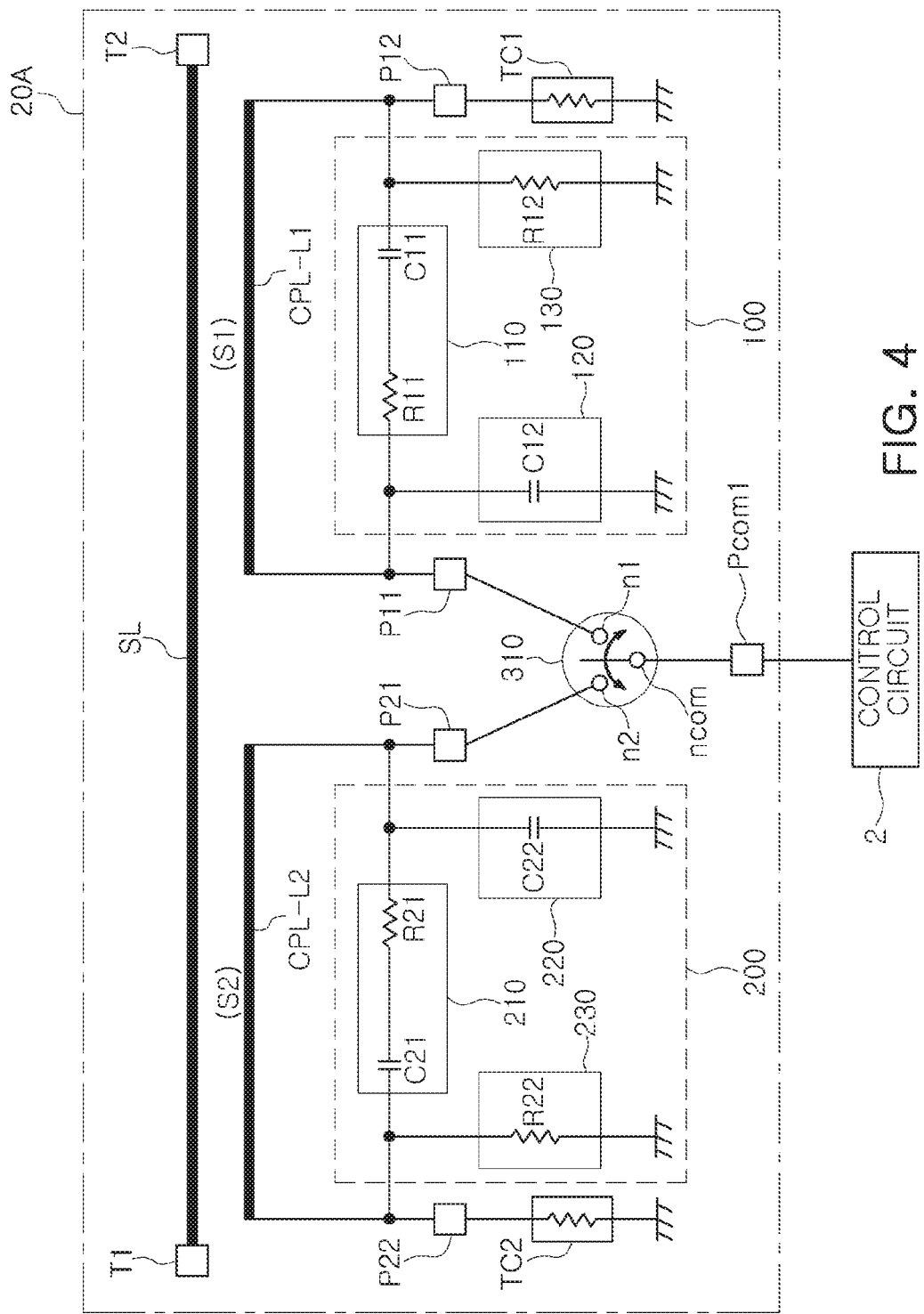
FIG. 4 is a view of a coupler circuit, according to an embodiment.

FIG. 4 is a view of a coupler circuit 20A, according to an embodiment.

Referring to FIG. 4, the coupler circuit 20A may include a first switching circuit 310 in addition to the components of the coupler circuit 20 shown in FIG. 2.

The first switching circuit 310 may include a first node n1 connected to the first coupling port P11, a second node n2 connected to the second coupling port P21, and a common node ncom connected to a first common coupling port Pcom1, and one of the first node n1 and the second node n2 may be selectively connected to the common node ncom.

One of the first coupling line CPL-L1 and the second coupling line CPL-L2 may be selected and connected to the control circuit 2 using the first switching circuit 310.

Figure 5:
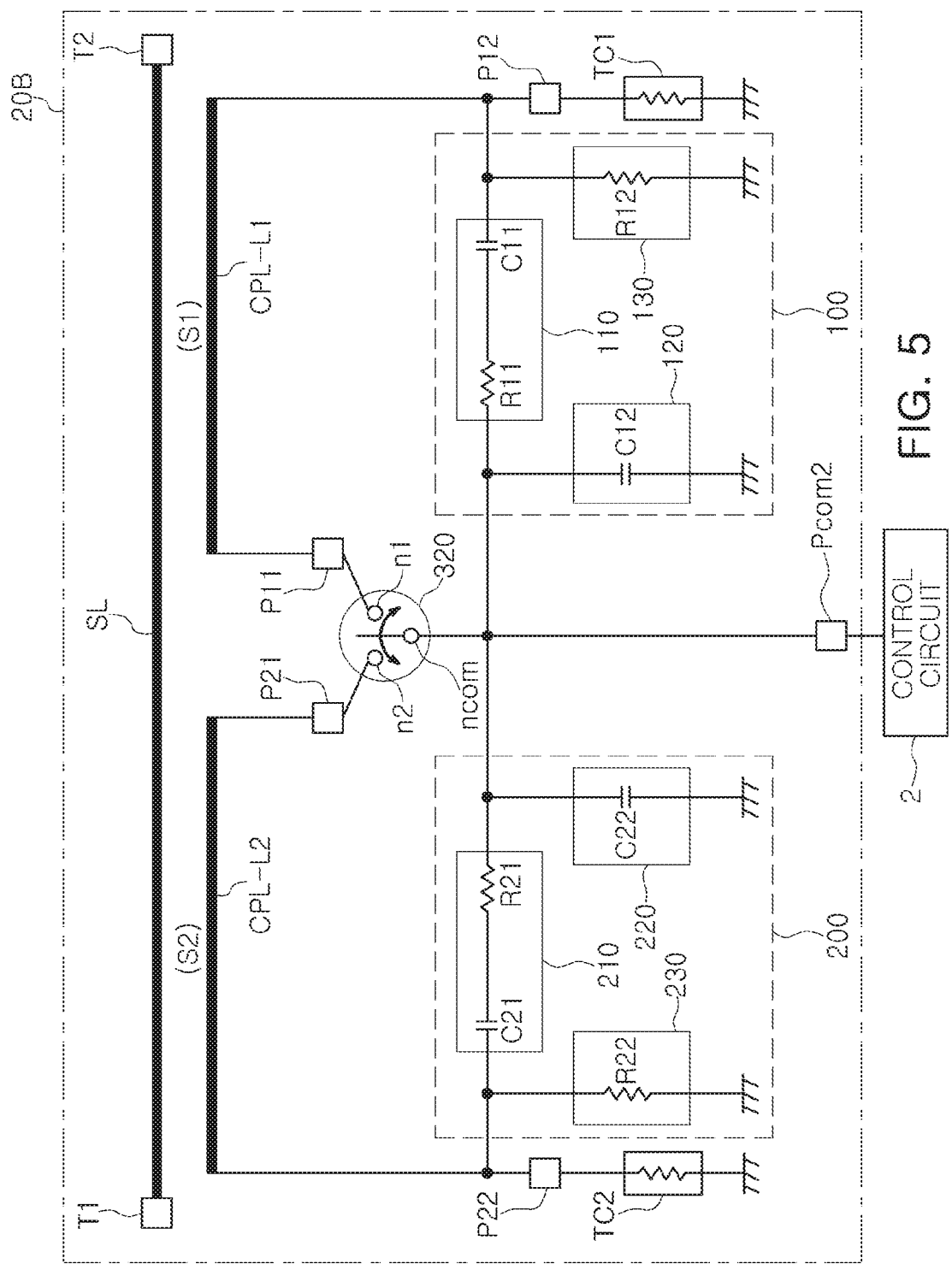
FIG. 5 is a view of a coupler circuit, according to an embodiment.

FIG. 5 is a view of a coupler circuit 20B, according to an embodiment.

Referring to FIG. 5, the coupler circuit 20B may include a signal line SL, a first coupling line CPL_L1, a second coupling line CPL_L2, a second switching circuit 320, a first coupling adjusting circuit 100, and a second coupling adjusting circuit 200.

The signal line SL may be disposed between a first terminal T1 and a second terminal T2.

The first coupling line CPL_L1 may be disposed between a first coupling port P11 and a first isolation port P12, such that the first coupling line CPL_L1 is firstly coupled to the signal line SL and is configured to extract a coupling signal S1 from the signal line SL.

The second coupling line CPL_L1 may be disposed between a second coupling port P21 and a second isolation port P22, such that the second coupling line CPL_L1 is secondly coupled to the signal line SL and is configured to extract a second coupling signal S2 from the signal line SL.

The second switching circuit 320 may include a first node n1 connected to the first coupling port P11, a second node n2 connected to the second coupling port P21, and a common node ncom connected to a second common coupling port Pcom2, and one of the first node n1 and the second node n2 may be selectively connected to the common node ncom.

The first coupling adjusting circuit 100 may be connected to the second common coupling port Pcom2 and the first isolation port P12 to reduce a change in the amount of coupling according to a change of frequency band of the signal passing through the signal line SL.

The second coupling adjusting circuit 200 may be connected to the second common coupling port Pcom2 and the second isolation port P22 to reduce a change in the amount of coupling according to a change of frequency band of the signal passing through the signal line SL.

Accordingly, one of the first coupling line CPL-L1 and the second coupling line CPL-L2 may be selected and connected to the control circuit using the second switching circuit 320.

Various modifications can be made to the coupling adjusting circuit 50, the first coupling adjusting circuit 100, and the second coupling adjusting circuit 200 described above. Modified examples of the coupling adjusting circuit 50 will be described below with reference to FIGS. 6, 7, and 8, and these modified examples may be applicable to the first coupling adjusting circuit 100 and the second coupling adjusting circuit 200.

Figure 6:
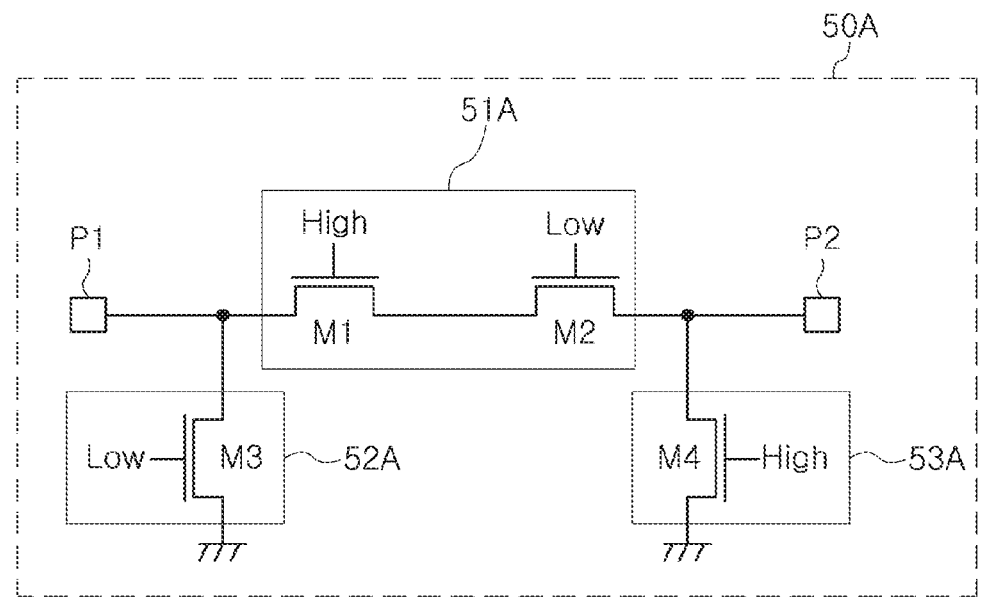
FIG. 6 is a view of a coupling adjusting circuit, according to an embodiment.

FIG. 6 is a view of a coupling adjusting circuit 50A, according to an embodiment.

Referring to FIG. 6, the coupling adjusting circuit 50A may include a first impedance circuit 51A, a second impedance circuit 52A, and a third impedance circuit 53A.

The first impedance circuit 51A may include a first MOSFET M1 as a first resistor R1 which is in turn-on state to have a turn-on resistance Ron, and a second MOSFET M2 as a first capacitor C1 which is in turn-off state to have a turn-off capacitance Coff.

The second impedance circuit 52A may include a third MOSFET M3 as a second capacitor C2 which is in turn-off state to have a turn-off capacitance Coff.

In addition, the third impedance circuit 53A may include a fourth MOSFET M4 as the second resistor R2 which is in turn-on state to have a turn-on resistance Ron.

Figure 7:
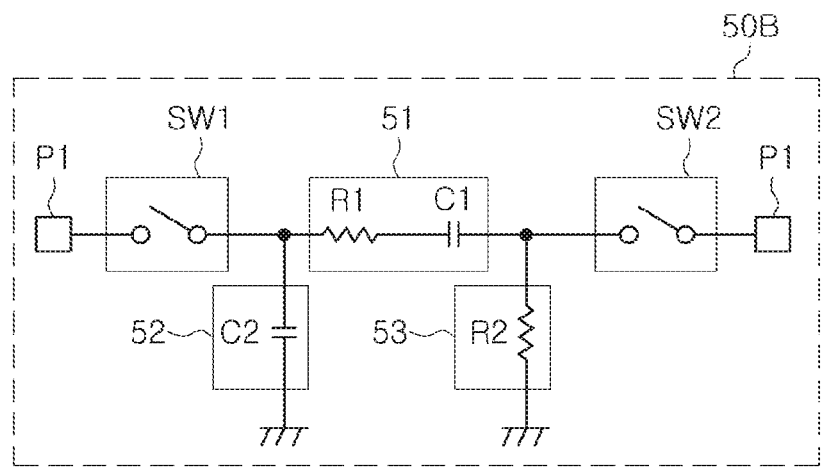
FIG. 7 is a view of a coupling adjusting circuit, according to an embodiment.

FIG. 7 is a view of a coupling adjusting circuit 50B, according to an embodiment.

Referring to FIGS. 1 and 7, the coupling adjusting circuit 50B shown in FIG. 7 may include a first switch SW1 and a second switch SW2 in addition to the components of the coupling adjusting circuit 50 shown in FIG. 1.

The first switch SW1 may be connected between the connection node of the first and second impedance circuits 51 and 52 and the coupling port P1. The second switch SW2 may be connected between the connection node of the first and third impedance circuits 51, 53 and the isolation port P2.

Accordingly, since the first and second switches SW1 and SW2 can be controlled using a switching control signal, whether the coupling adjusting circuit 50C is used can be selected.

Figure 8:
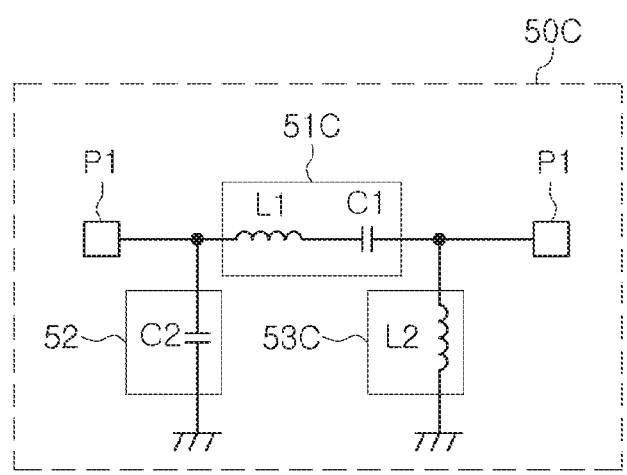
FIG. 8 is a view of a coupling adjusting circuit, according to an embodiment.

FIG. 8 is a view of a coupling adjusting circuit 50C, according to an embodiment.

Referring to FIGS. 1 and 8, the coupling adjusting circuit 50C may include a first impedance circuit 51C, a second impedance circuit 52, and a third impedance circuit 53C.

The first impedance circuit 51C may include a first inductor L1 in place of the first resistor R1 in FIG. 1.

The third impedance circuit 53C may include a second inductor L2 in place of the second resistor R2 in FIG. 1.

Figure 9A:
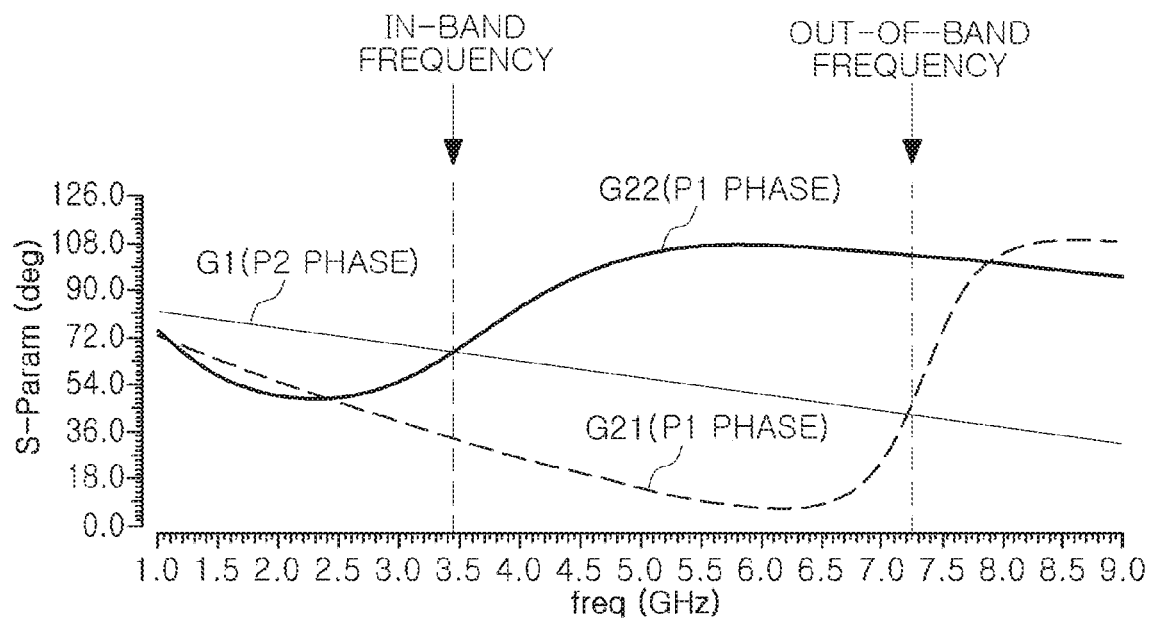
FIG. 9A is a phase graph of a coupling port and an isolation port of a coupler circuit, according to an embodiment.
Figure 9B:
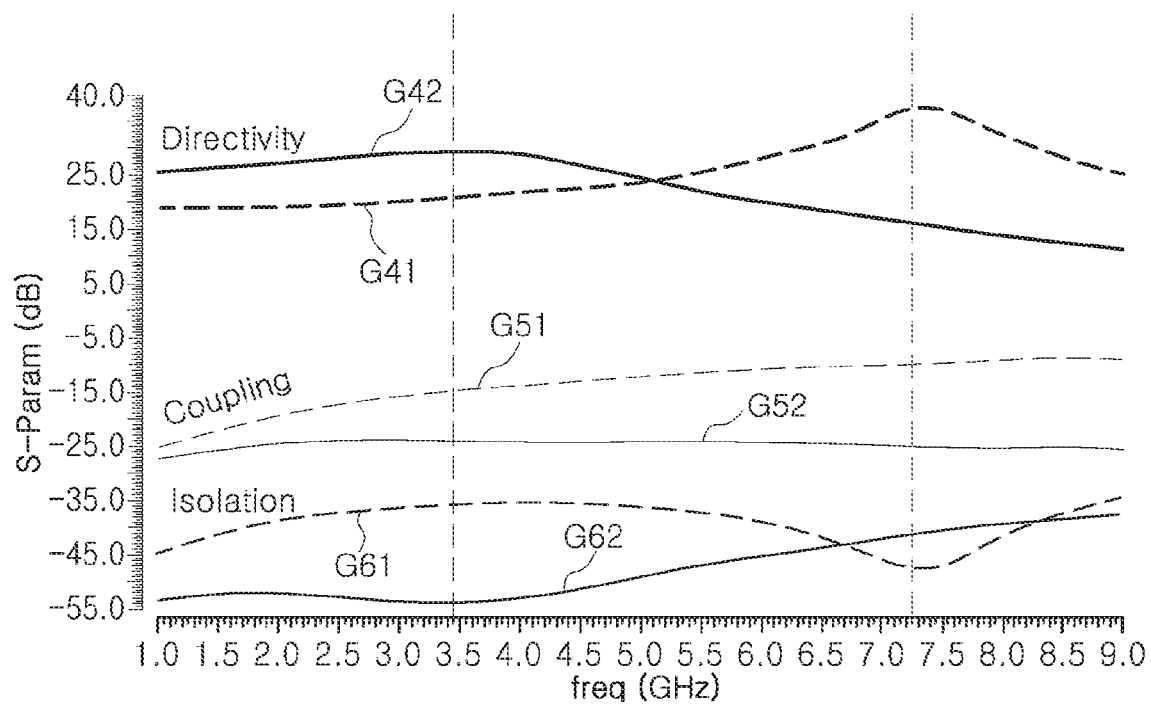
FIG. 9B is a graph showing a level of directivity, coupling, and isolation of a coupler circuit, according to an embodiment.

FIG. 9A is a phase graph of a coupling port and an isolation port of a coupler circuit (e.g., coupler circuit 10, 20, 20A, or 20B) according to an embodiment, and FIG. 9B is a graph showing a level of directivity, coupling, and isolation of the coupler circuit.

In FIG. 9A, G1 is the phase graph of the isolation port P2, G21 is the phase graph of the coupling port P1 when the coupling adjusting circuit (e.g., coupling adjusting circuit 50, 50A, 50B, or 50B) is not applied, and G22 is the phase graph of the coupling port P1 when the coupling adjusting circuit is applied.

Referring to G1, G21 and G22, it can be seen that, when the coupling adjusting circuit is not applied, the frequency having no phase difference between the coupling port P1 and the isolation port P2 is approximately 7.25 GHz, which is out-of-band frequency considerably higher than one of the in-band frequencies, i.e., 3.5 GHz, and that, when the coupling adjusting circuit is applied, the frequency having no phase difference between the coupling port P1 and the isolation port P2 is changed to almost the same frequency as one of the in-band frequencies, i.e., 3.5 GHz.

According to the above, it can be seen that, by using the coupling adjusting circuit, the frequency having no phase difference between the coupling port P1 and the isolation port P2 may be adjusted.

In FIG. 9B, G41 and G42 are graphs showing the levels of directivity according to whether the coupling adjusting circuit (e.g., coupling adjusting circuit 50, 50A, 50B, or 50B) is applied, G51 and G52 are graphs showing coupling levels according to whether the coupling adjusting circuit is applied, and G61 and G62 are graphs showing isolation levels according to whether the coupling adjusting circuit is applied.

Comparison of G41 and G42 indicates that the level of directivity is improved in the vicinity of the used frequency of about 3.5 GHz when the coupling adjusting circuit is applied, comparison of G51 and G52 indicates that the coupling level remains relatively constant even with the changed frequency band when the coupling adjusting circuit is applied, and comparison of G61 and G62 indicates that the isolation level is reduced in the vicinity of one of the in-band frequencies, that is, approximately 3.5 GHz, when the coupling adjusting circuit is applied.

The above description is applicable to FIGS. 10A and 10B, and to FIGS. 11A and 11B, and redundant description of these figures may be omitted below.

Figure 10A:
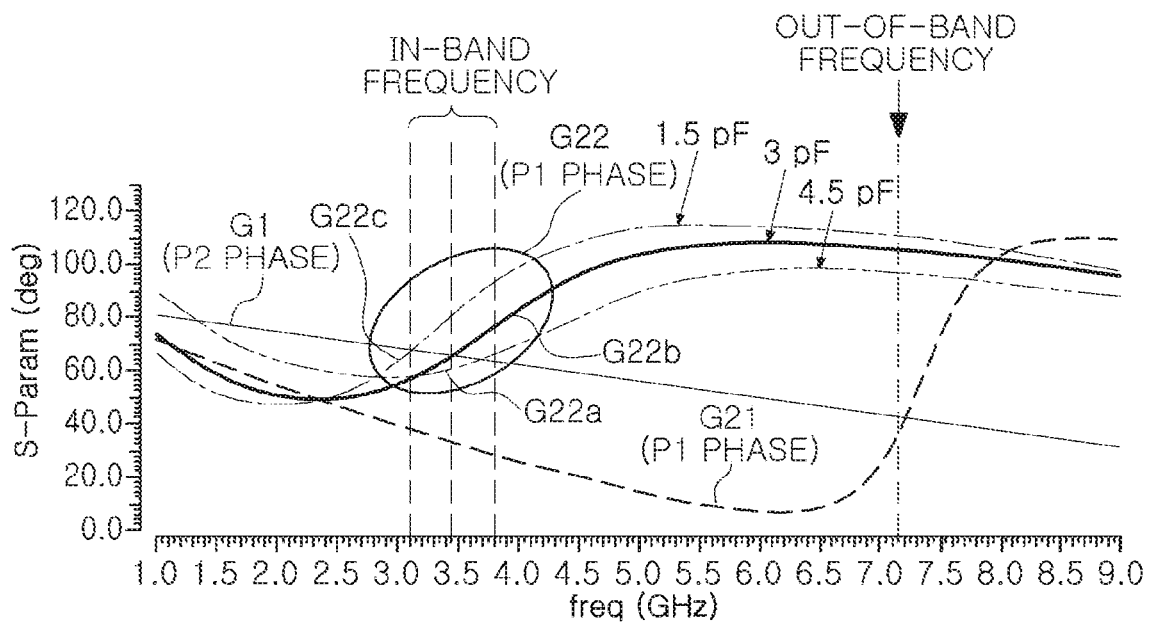
FIG. 10A is a phase graph of a coupling port and an isolation port according to a capacitance value of a coupler circuit, according to an embodiment.

FIG. 10A is a phase graph of a coupling port P1 and an isolation port P2 according to a capacitance value of a coupler circuit (e.g., coupler circuit 10, 20, 20A, or 20B). FIG. 10B is a graph showing a level of directivity, coupling and isolation according to a capacitance value of a coupler circuit.

In FIG. 10A, each of G22$a$, G22$b$ and G22$c$ included in G22 are the phase graphs of the coupling port P1, when the capacitance values of the first and second capacitors C1 and C2 are 4.5 pF, 3 pF and 1.5 pF, respectively.

Referring to G22$a$, G22$b$ and G22$c$, it can be seen that, when the capacitance values of each of the first capacitor C1 and the second capacitor C2 are changed, the frequency having no phase difference between the coupling port P1 and the isolation port P2 is changed.

According to the above, it can be seen that, by changing the capacitance values of the first capacitor C1 and the second capacitor C2, the frequency having no phase difference between the coupling port P1 and the isolation port P2 is adjusted.

Figure 10B:
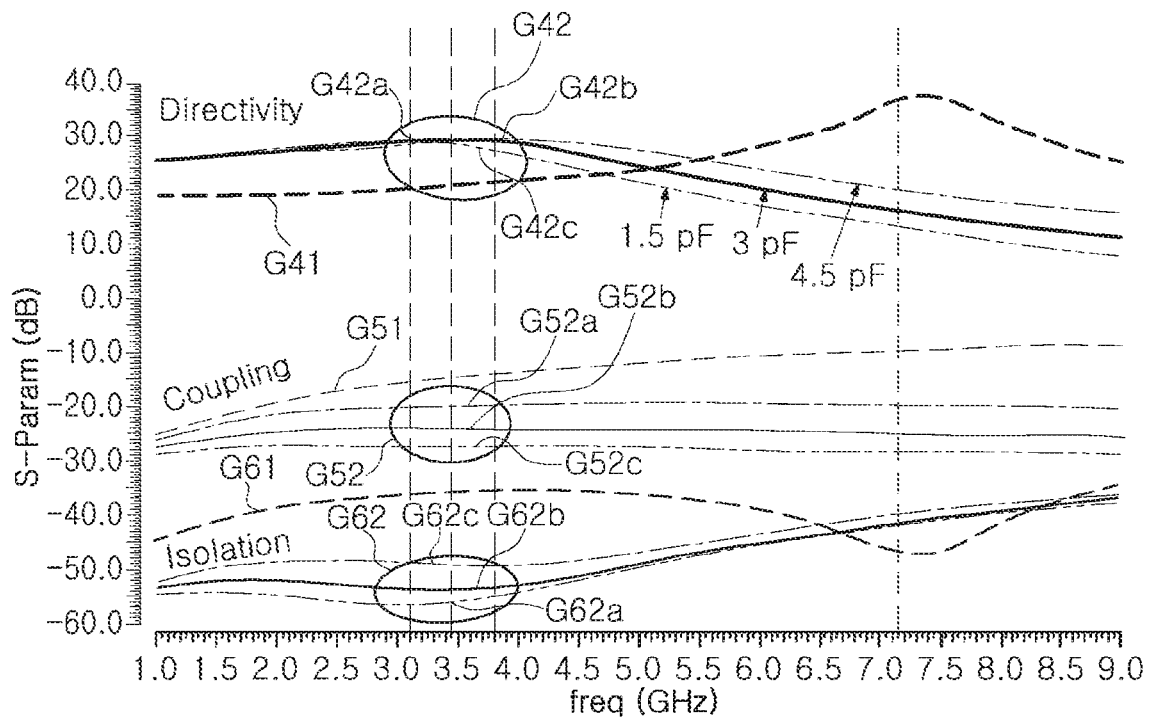
FIG. 10B is a graph showing a level of directivity, coupling, and isolation according to a capacitance value of a coupler circuit, according to an embodiment.

In FIG. 10B, each of G42$a$, G42$b$ and G42$c$ included in G42 are graphs showing the directivity levels when the capacitance values of each of the first capacitor C1 and the second capacitor C2 in FIG. 1 are 4.5 pF, 3 pF and 1.5 pF, respectively. Referring to G42$a$, G42$b$ and G42$c$, it can be seen that the directivity level is varied when the capacitance values of each of the first capacitor C1 and the second capacitor C2 are changed.

Each of G52$a$, G52$b$ and G52$c$ included in G52 are graphs showing the coupling levels when the capacitance values of each of the first capacitor C1 and the second capacitor C2 in FIG. 1 are 4.5 pF, 3 pF and 1.5 pF, respectively. Referring to G52$a$, G52$b$ and G52$c$, it can be seen that the coupling level remains relatively constant even with the changed frequency band, when the capacitance values of each of the first capacitor C1 and the second capacitor C2 are changed.

In addition, each of G62$a$, G62$b$ and G62$c$ included in G62 are graphs showing the isolation levels when the capacitance values of each of the first capacitor C1 and the second capacitor C2 in FIG. 1 are 4.5 pF, 3 pF and 1.5 pF, respectively. Referring to G62$a$, G62$b$ and G62$c$, it can be seen that the isolation level is varied when the capacitance values of each of the first capacitor C1 and the second capacitor C2 are changed.

Figure 11A:
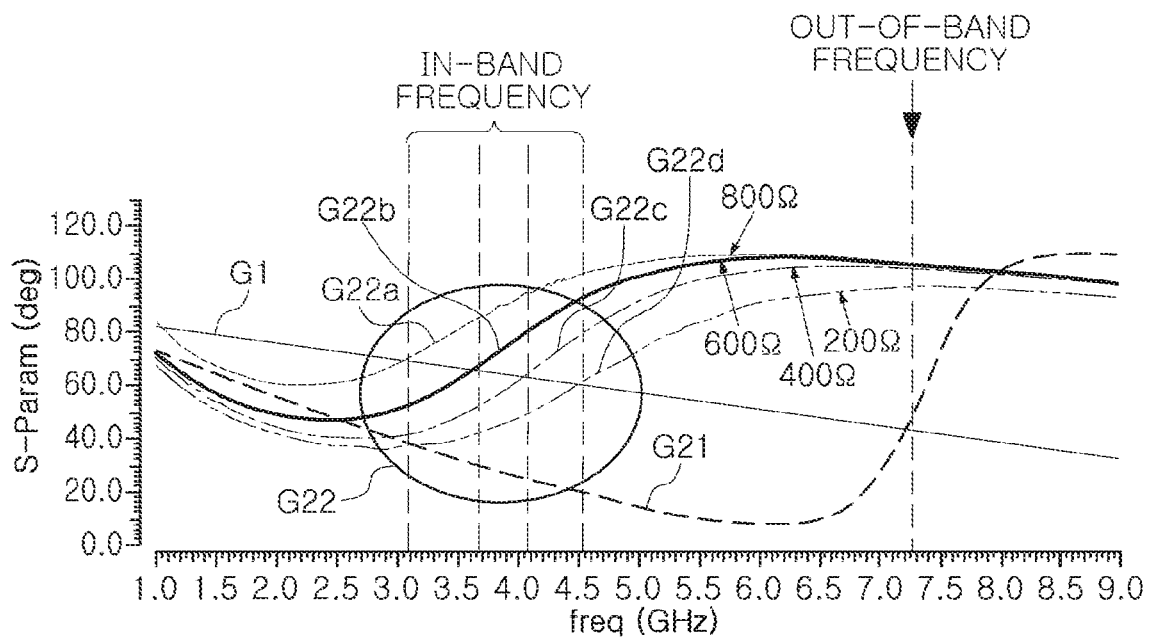
FIG. 11A is a phase graph of a coupling port and an isolation port of a coupler circuit according to a resistance value of the coupler circuit, according to an embodiment.
Figure 11B:
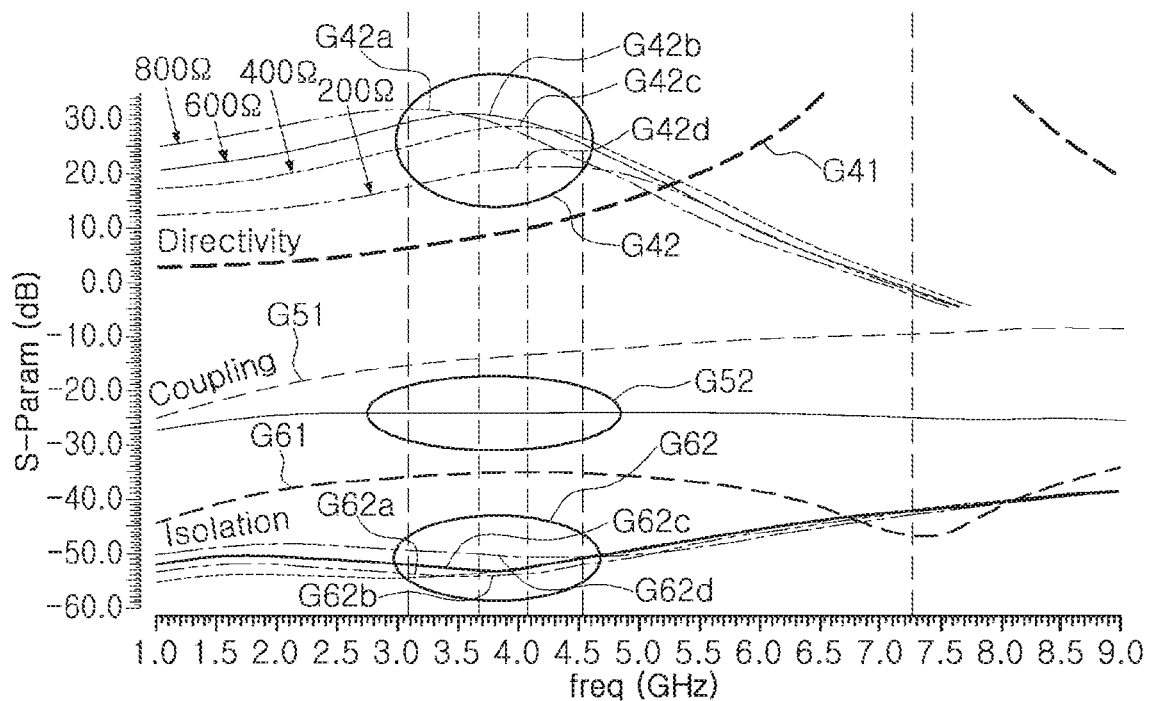
FIG. 11B is a graph showing a level of directivity, coupling, and isolation of a coupler circuit according to a resistance value of the coupler circuit, according to an embodiment.

FIG. 11A is a phase graph of a coupling port P1 and an isolation port P2 of a coupler circuit (e.g., coupler circuit 10, 20, 20A, or 20B) according to a resistance value, and FIG. 11B is a graph showing a level of directivity, coupling, and isolation of the coupler circuit according to a resistance value of the coupler circuit.

In FIG. 11A, each of G22$a$, G22$b$, G22$c$, and G22$d$ included in G22 are phase graphs of the coupling port P1 when the resistance values of each of the first resistor R1 and the second resistor R2 in FIG. 1 are 800Ω, 600Ω, 400Ω and 200Ω, respectively.

Referring to G22$a$, G22$b$, G22$c$ and G22$d$, it can be seen that, when the resistance values of each of the first resistor R1 and second resistor R2 are changed, the frequency having no phase difference between the coupling port P2 and the isolation port P2 is changed.

According to the above, it can be seen that, by changing the resistance values of each of the first resistor R1 and the second resistor R2, the frequency having no phase difference between the coupling port P2 and the isolation port P2 can be adjusted.

In FIG. 11B, each of G42$a$, G42$b$, G42$c$, and G42$d$ included in G42 are graphs showing directivity levels when the resistance values of each of the first resistor R1 and the second resistor R2 in FIG. 1 are 800Ω, 600Ω, 400Ω and 200Ω, respectively. Referring to G42a, G42b, G42c, and G42d, it can be seen that the directivity level is varied when the resistance values of each of the first resistor R1 and the second resistor R2 are changed.

G52 is a graph showing coupling level when the resistance values of each of the first resistor R1 and the second resistor R2 in FIG. 1 are 800Ω, 600Ω, 400Ω and 200Ω, respectively. Referring to G52, it can be seen that the coupling level remains relatively constant even with the changed frequency band, when the resistance values of each of the first resistor R1 and the second resistor R2 are changed.

Further, each of G62a, G62b, G62c, and G62d included in G62 are graphs showing isolation levels when the resistance values of each of the first resistor R1 and the second resistor R2 in FIG. 1 are 800Ω, 600Ω, 400Ω and 200Ω, respectively. Referring to G62a, G62b, G62c, and G42d, it can be seen that the isolation level is varied when the resistance values of each of the first resistor R1 and the second resistor R2 are changed.

Figure 12:
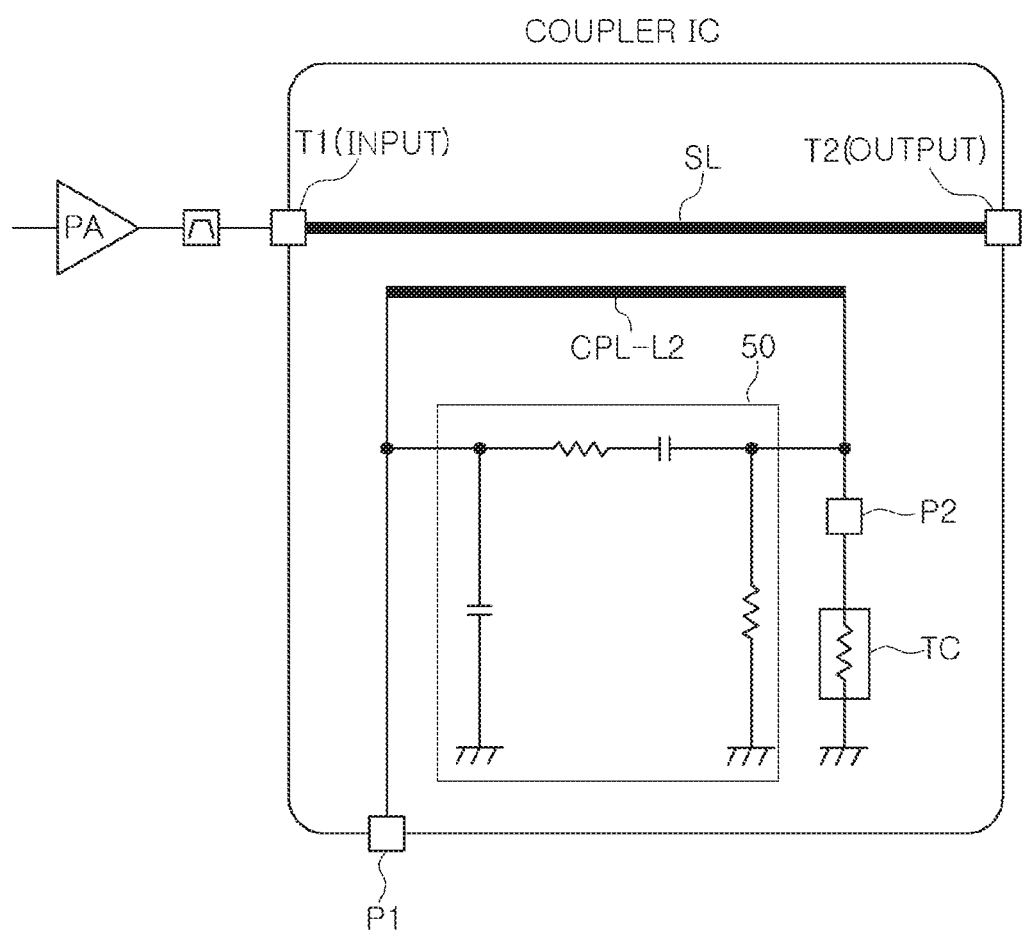
FIG. 12 is a view of a first application of a coupler circuit, according to an embodiment.

FIG. 12 is a view of a first application of a coupler circuit (e.g., coupler circuit 10, 20, 20A, or 20B), according to an embodiment.

Referring to FIG. 12, one of the coupler circuits 10, 20, 20A, and 20B shown in FIGS. 1 to 5 may be implemented as an integrated circuit (IC) and applied to the output of a power amplifier PA. That is, the first input terminal T1 of the coupler circuit may be connected to the output of the power amplifier PA. Although FIG. 12 illustrates the coupling adjusting circuit 50 of the coupler circuit 20, the disclosure is not limited to this example.

Figure 13:
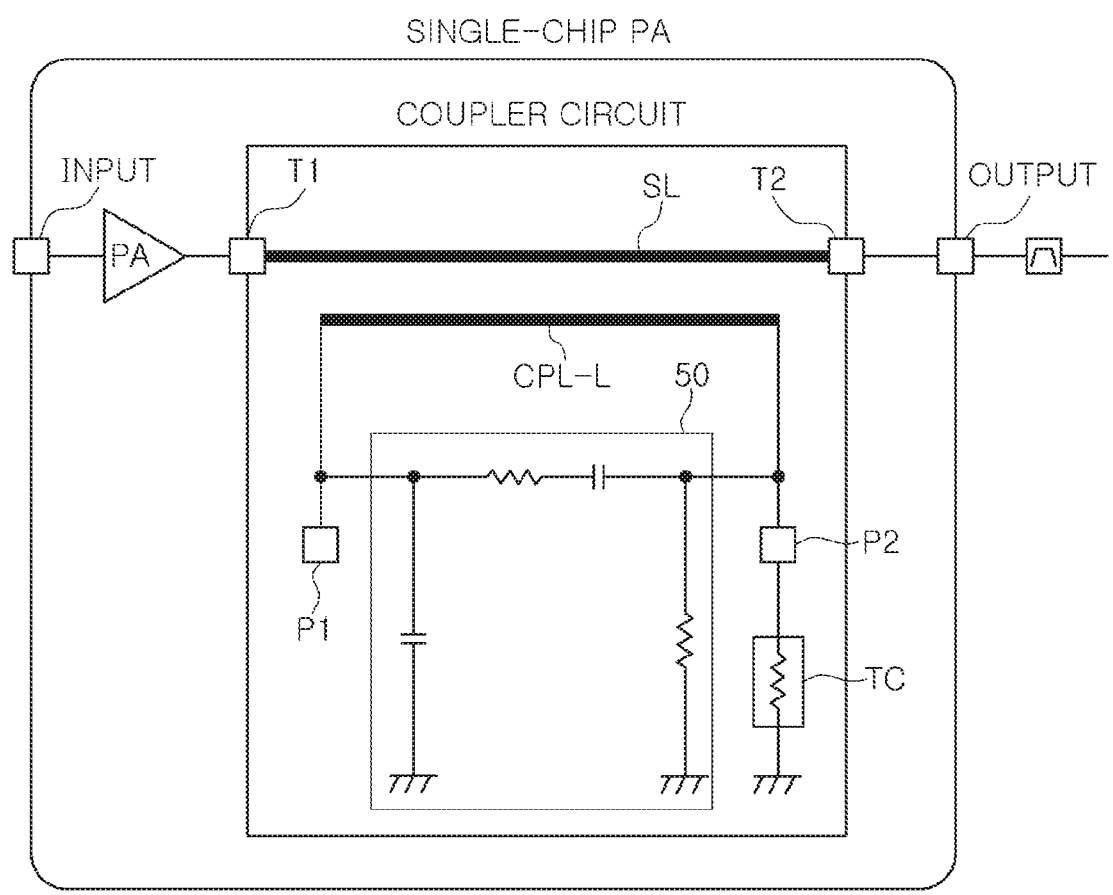
FIG. 13 is a view of a second application of a coupler circuit, according to an embodiment.

FIG. 13 is a view of a second application of a coupler circuit (e.g., coupler circuit 10, 20, 20A, or 20B), according to an embodiment.

Referring to FIG. 13, one of the coupler circuits 10, 20, 20A, and 20B shown in FIGS. 1 to 5 may be applied together with the power amplifier PA to be implemented as a single-chip PA. In the single-chip PA, the first terminal T1 of the signal line SL may be connected to an output of the PA. The single-chip PA may include an input terminal connected to an input of the PA, and an output terminal connected to the second terminal T2 of the signal line SL. Although FIG. 13 illustrates the coupling adjusting circuit 50 of the coupler circuit 20, the disclosure is not limited to this example.

Figure 14:
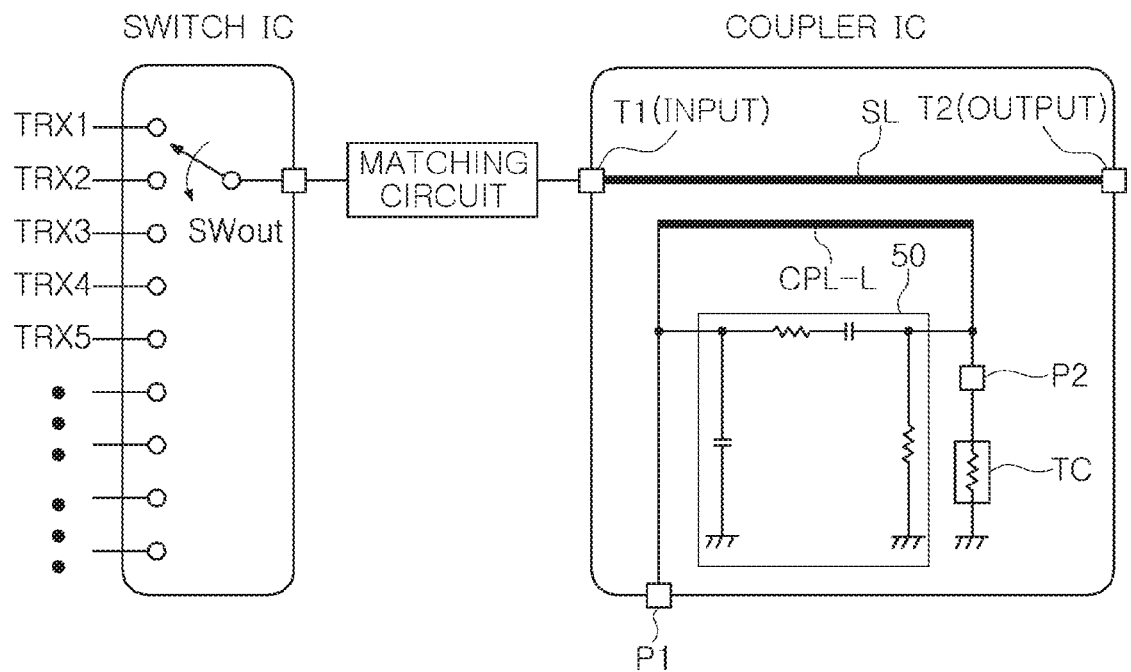
FIG. 14 is a view of a third application of a coupler circuit, according to an embodiment.

FIG. 14 is a view of a third application of a coupler circuit (e.g., coupler circuit 10, 20, 20A, or 20B), according to an embodiment.

Referring to FIG. 14, one of the coupler circuits 10, 20, 20A, and 20B shown in FIGS. 1 to 5 may be implemented as a coupler integrated circuit (IC) and applied to the output of the switch IC, in which case a matching circuit may be added between the coupler IC and the switch IC.

Although FIG. 14 illustrates the coupling adjusting circuit 50 of the coupler circuit 20, the disclosure is not limited to this example.

Figure 15:
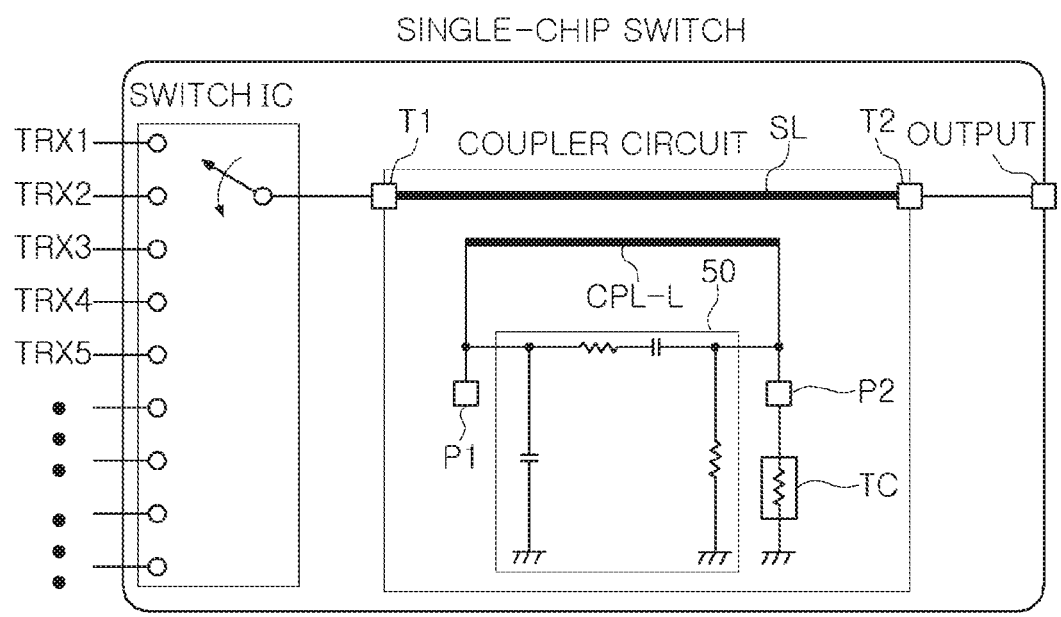
FIG. 15 is a view of a fourth application of a coupler circuit, according to an embodiment.

FIG. 15 is a view of a fourth application of a coupler circuit (e.g., coupler circuit 10, 20, 20A, or 20B), according to an embodiment.

Referring to FIG. 15, one of the coupler circuits 10, 20, 20A, and 20B shown in FIGS. 1 to 5 may be applied together with the switching circuit to be implemented as a single-chip switch.

Figure 16:
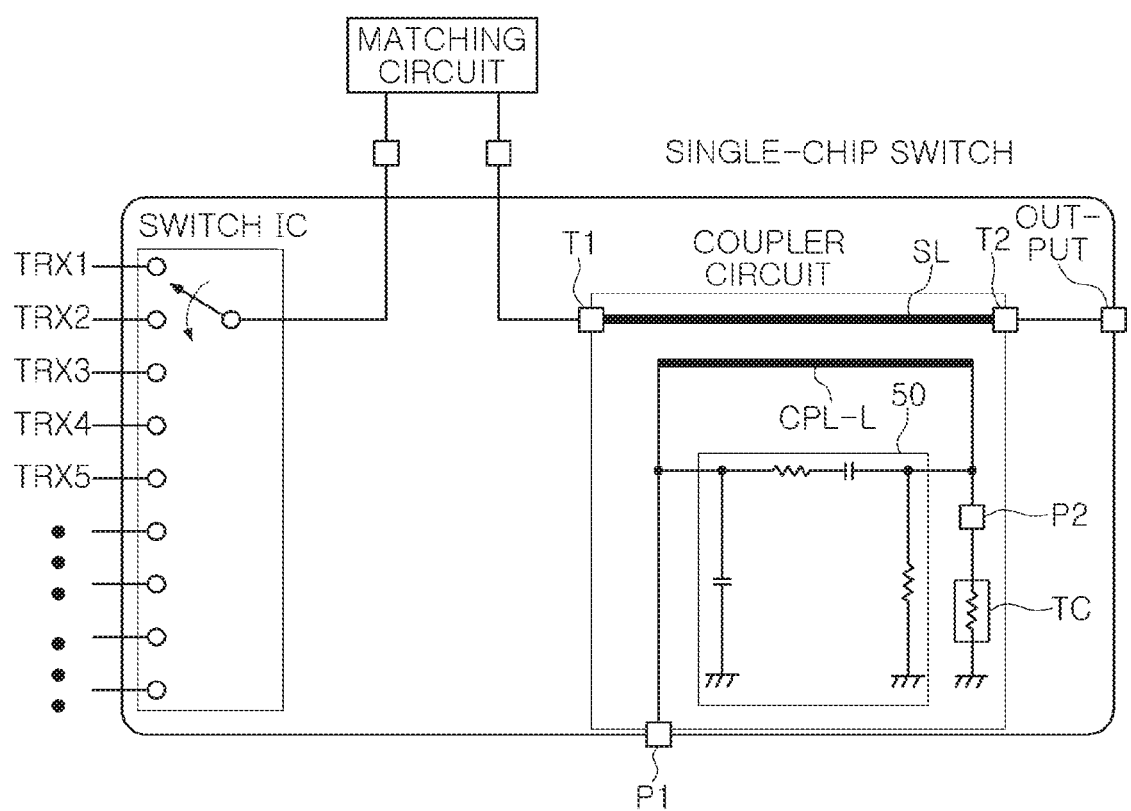
FIG. 16 is a view of a fifth application of a coupler circuit, according to an embodiment.

FIG. 16 is a view of a fifth application of a coupler circuit (e.g., coupler circuit 10, 20, 20A, or 20B), according to an embodiment.

Referring to FIG. 16, one of the coupler circuits 10, 20, 20A, and 20B shown in FIGS. 1 to 5 may be applied together with the switching circuit to be implemented as a single-chip switch, and in FIG. 16, a matching circuit may be included between the switch IC and the coupler circuit.

The control circuit 2, according to an embodiment, may be implemented in a computing environment where a processor (e.g., a central processing unit (CPU)), a graphics processing unit (GPU), a microprocessor, an application specific integrated circuit (ASIC), a field programmable gate array (e.g., FPGA, etc.)), a memory (e.g., a volatile memory (e.g., RAM)), a nonvolatile memory (e.g., ROM, flash memory, etc.), an input device (e.g., a keyboard, a mouse, a pen, a voice input device, a touch input device, an infrared camera, a video input device, etc.), an output device (e.g., a display, a speaker, a printer, etc.) and a communication access device (e.g., a modem, a network interface card (NIC), an integrated network interface, a radio frequency transmitter/receiver, an infrared port, a USB connection device, etc.) are interconnected (e.g., by peripheral component interconnect (PCI), USB, firmware (IEEE 1394), optical bus architecture, network, etc.).

The computing environment may be implemented as a distributed computing environment including a personal computer, a server computer, a handheld or laptop device, a mobile device (mobile phone, PDA, media player, etc.), a multiprocessor system, a consumer electronic device, a minicomputer, a mainframe computer, any of the systems or devices described above, or the like, but is not limited thereto.

As set forth above, according to the embodiments disclosed herein, in an application such as a power amplifying device or an antenna switch device using a plurality of frequency bands, it is possible to reduce a change in coupling according to a change in a frequency band and reduce an amount of coupling by a reflected wave. As a result, directivity and isolation characteristics can be improved.

The controller 2 in FIGS. 1, 2, 4, and 5 that performs the operations described in this application is implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A coupler circuit having a phase compensation function, comprising:
   a signal line disposed between a first terminal and a second terminal;
   a coupling line disposed between a coupling port and an isolation port such that the coupling line is coupled to the signal line and is configured to extract a coupling signal from the signal line; and
   a coupling adjusting circuit connected to the coupling port and the isolation port, and configured to reduce changes in an amount of coupling according to a change in a frequency band of a signal passing through the signal line, wherein the coupling adjusting circuit comprises:
   a first impedance circuit comprising a resistor and a capacitor connected between the coupling port and the isolation port in series;
   a second impedance circuit connected between the coupling port and ground; and
   a third impedance circuit connected between the isolation port and the ground.

2. The coupler circuit of claim 1, wherein the coupling adjusting circuit is configured to reduce a phase difference between the coupling port and the isolation port.

3. The coupler circuit of claim 1, wherein the second impedance circuit comprises a capacitor connected between the coupling port and the ground.

4. The coupler circuit of claim 1, wherein the third impedance circuit comprises a resistor connected between the isolation port and the ground.

5. A coupler circuit having a phase compensation function, comprising:
   a signal line disposed between a first terminal and a second terminal;
   a first coupling line disposed between a first coupling port and a first isolation port such that the first coupling line is coupled to the signal line and is configured to extract a first coupling signal from the signal line;
   a first coupling adjusting circuit connected to the first coupling port and the first isolation port;

a second coupling line disposed between a second coupling port and a second isolation port such that the second coupling line is coupled to the signal line and is configured to extract a second coupling signal from the signal line;

a second coupling adjusting circuit connected to the second coupling port and the second isolation port; and a first switching circuit including a first node connected to the first coupling port, a second node connected to the second coupling port, and a common node connected to a first common coupling port, wherein the first switching circuit is configured to selectively connect one of the first node and the second node to the common node, and wherein the first coupling adjusting circuit and the second coupling adjusting circuit are each configured to reduce changes in an amount of coupling according to a change in a frequency band of a signal Passing through the signal line.

6. The coupler circuit of claim 5, wherein the first coupling adjusting circuit is configured to reduce a phase difference between the first coupling port and the first isolation port, and the second coupling adjusting circuit is configured to reduce a phase difference between the second coupling port and the second isolation port.

7. The coupler circuit of claim 6, wherein the first coupling adjusting circuit comprises:
a first impedance circuit connected between the first coupling port and the first isolation port;
a second impedance circuit connected between the first coupling port and the ground; and
a third impedance circuit connected between the first isolation port and the ground.

8. The coupler circuit of claim 7, wherein the second coupling adjusting circuit comprises:
a fourth impedance circuit connected between the second coupling port and the second isolation port;
a fifth impedance circuit connected between the second coupling port and the ground; and
a sixth impedance circuit connected between the second isolation port and the ground.

9. The coupler circuit of claim 8, wherein the first impedance circuit comprises a first resistor and a first capacitor connected between the first coupling port and the first isolation port in series, and the fourth impedance circuit comprises a second resistor and a second capacitor connected between the second coupling port and the second isolation port in series.

10. The coupler circuit of claim 8, wherein the second impedance circuit comprises a first capacitor connected between the first coupling port and the ground, and the fifth impedance circuit comprises a second capacitor connected between the second coupling port and the ground.

11. The coupler circuit of claim 8, wherein the third impedance circuit comprises a first resistor connected between the first isolation port and the ground, and the sixth impedance circuit comprises a second resistor connected between the second isolation port and the ground.

12. A single-chip power amplifier, comprising:
a power amplifier; and
a coupler circuit connected to the power amplifier, and comprising:
a signal line disposed between a first terminal and a second terminal;
a coupling line disposed between a coupling port and an isolation port such that the coupling line is coupled to the signal line and is configured to extract a coupling signal from the signal line; and
a coupling adjusting circuit connected to the coupling port and the isolation port, and configured to reduce changes in an amount of coupling according to a change in a frequency band of a signal passing through the signal line, wherein the coupling adjusting circuit comprises:
a first impedance circuit comprising a resistor and a capacitor connected between the coupling port and the isolation port in series,
a second impedance circuit connected between the coupling port and ground, and
a third impedance circuit connected between the isolation port and the ground.

13. The single-chip power amplifier of claim 12, further comprising:
an input terminal connected to an input of the power amplifier; and
an output terminal connected to the second terminal,
wherein the first terminal is connected to an output of the power amplifier.

* * * * *